(12) United States Patent
Cho et al.

(10) Patent No.: US 10,794,959 B2
(45) Date of Patent: Oct. 6, 2020

(54) BATTERY MANAGEMENT SYSTEM HAVING SEPARATE VOLTAGE MEASURING UNIT AND CONTROL UNIT

(71) Applicant: LG CHEM, LTD., Seoul (KR)

(72) Inventors: Hyunki Cho, Daejeon (KR); Jaedong Park, Daejeon (KR); Sang Hoon Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 16/083,414

(22) PCT Filed: Apr. 26, 2017

(86) PCT No.: PCT/KR2017/004434
§ 371 (c)(1),
(2) Date: Sep. 7, 2018

(87) PCT Pub. No.: WO2018/038348
PCT Pub. Date: Mar. 1, 2018

(65) Prior Publication Data
US 2019/0101598 A1    Apr. 4, 2019

(30) Foreign Application Priority Data

Aug. 26, 2016  (KR) .......................... 10-2016-0109326

(51) Int. Cl.
*H02J 7/00*      (2006.01)
*G01R 31/3835*   (2019.01)
(Continued)

(52) U.S. Cl.
CPC ......... *G01R 31/3835* (2019.01); *G01R 31/36* (2013.01); *G01R 31/388* (2019.01);
(Continued)

(58) Field of Classification Search
CPC .................................................. G01R 31/3835
(Continued)

(56) References Cited

U.S. PATENT DOCUMENTS 6,501,249 B1 *  12/2002  Drori ................... H02J 7/0031
                                                          320/149
8,405,352 B2 *  3/2013   Lim .................... H02J 7/0016
                                                          320/116
(Continued)

FOREIGN PATENT DOCUMENTS

JP      2011-155829 A       8/2011
KR  10-2007-0109084 A      11/2007
(Continued)

OTHER PUBLICATIONS

International Search Report (PCT/ISA/210) issued in PCT/KR2017/004434, dated Aug. 7, 2017.

*Primary Examiner* — Yalkew Fantu
(74) *Attorney, Agent, or Firm* — Birch, Stewart, Kolasch & Birch, LLP

(57) ABSTRACT

The present invention relates to a battery management system, and to a battery management system, in which a voltage measuring unit measuring a voltage of a battery and a control unit controlling the battery based on the measured voltage value are separated in a battery management controller included in an existing battery management system and the voltage measuring unit is included in the battery disconnecting unit, thereby preventing insulation resistance between the voltage measuring unit and the control unit from being decreased.

7 Claims, 4 Drawing Sheets

(51) Int. Cl.
  *H01M 10/42* (2006.01)
  *G01R 31/36* (2020.01)
  *G01R 31/388* (2019.01)
  *H01M 10/48* (2006.01)
  *H02J 7/14* (2006.01)

(52) U.S. Cl.
  CPC ......... *H01M 10/42* (2013.01); *H01M 10/425* (2013.01); *H01M 10/48* (2013.01); *H02J 7/0031* (2013.01); *H02J 7/1469* (2013.01); *H01M 2010/4271* (2013.01); *H01M 2010/4278* (2013.01)

(58) Field of Classification Search
  USPC ........................................................ 320/132
  See application file for complete search history.

(56) References Cited

U.S. PATENT DOCUMENTS

| | | | | |
|---|---|---|---|---|
| 2006/0012341 | A1* | 1/2006 | Burns | H02J 7/0019 320/132 |
| 2011/0080138 | A1* | 4/2011 | Nakanishi | H02J 7/0016 320/116 |
| 2011/0156618 | A1 | 6/2011 | Seo et al. | |
| 2011/0169458 | A1 | 7/2011 | Sugiura | |
| 2012/0200264 | A1* | 8/2012 | Choi | H02J 3/32 320/132 |
| 2013/0069661 | A1* | 3/2013 | Rich | H01M 10/42 324/433 |
| 2013/0207464 | A1 | 8/2013 | Kluthe et al. | |
| 2013/0249446 | A1* | 9/2013 | Kumagai | H01M 10/44 318/139 |

FOREIGN PATENT DOCUMENTS

| | | |
|---|---|---|
| KR | 10-2011-0059318 A | 6/2011 |
| KR | 10-2011-0081786 A | 7/2011 |
| KR | 10-2013-0031365 A | 3/2013 |
| KR | 10-1584322 B1 | 1/2016 |

* cited by examiner

[Figure 1]
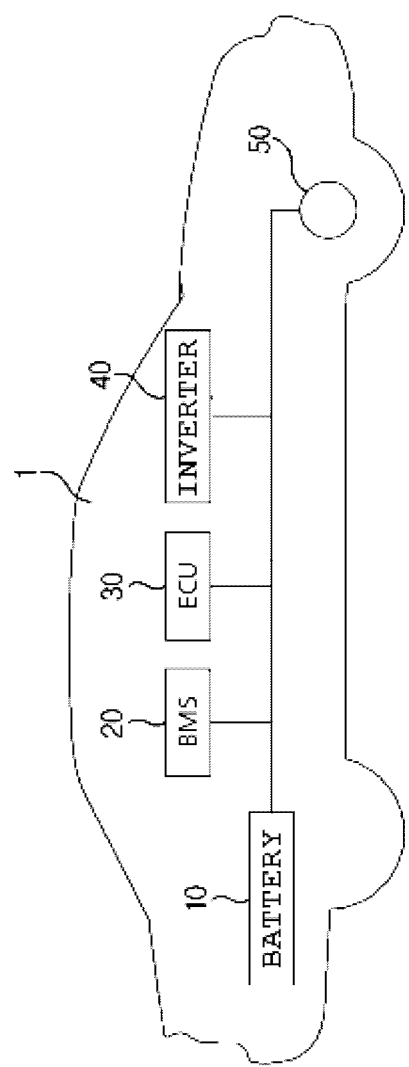

[Figure 2]
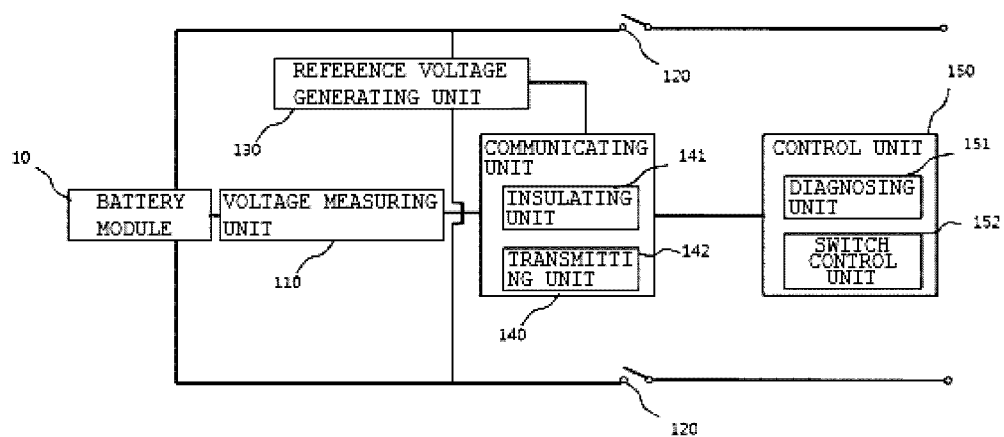

[Figure 3]
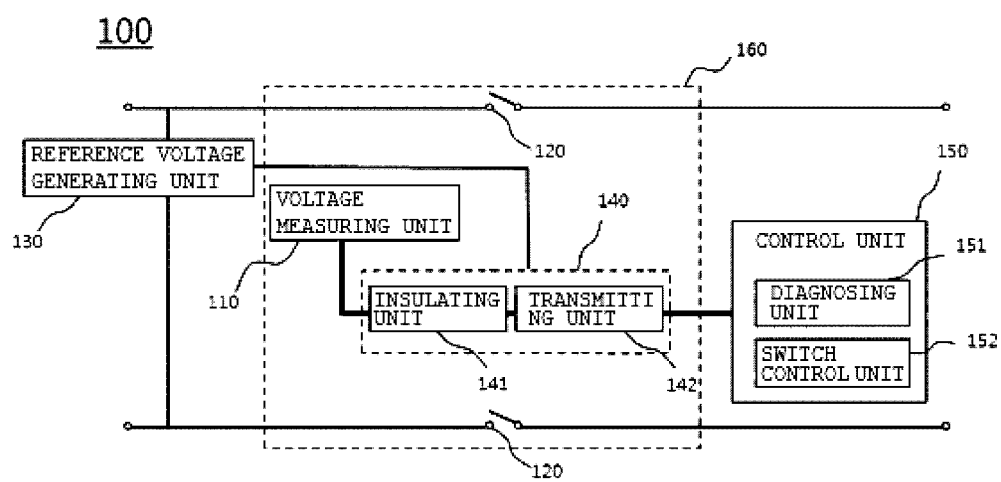

[Figure 4]
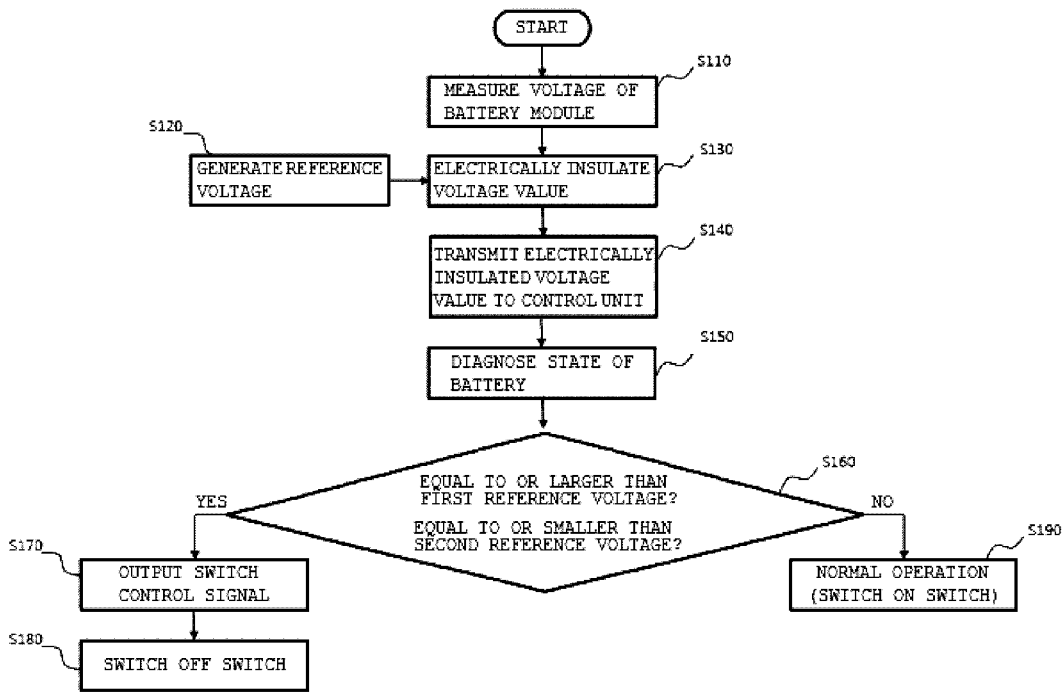

BATTERY MANAGEMENT SYSTEM HAVING SEPARATE VOLTAGE MEASURING UNIT AND CONTROL UNIT

TECHNICAL FIELD

This application claims priority to and the benefit of Korean Patent Application No. 10-2016-0109326 filed in the Korean Intellectual Property Office on Aug. 26, 2016, the entire contents of which are incorporated herein by reference.

TECHNICAL FIELD

The present invention relates to a battery management system, and to a battery management system, in which a voltage measuring unit which is connected to a battery side that is a high voltage part in an existing battery management controller (BMC) and measures a voltage of the battery is separated from a control unit which controls a switch based on the measured voltage value, and the voltage measuring unit is included in a battery disconnecting unit (BDU) and the voltage measuring unit and the control unit exchange information through insulated communication, thereby preventing insulation resistance between the voltage measuring unit and the control unit from being decreased.

BACKGROUND ART

A secondary battery, which has high application easiness according to a product group and an electric characteristic, such as a high energy density, has been universally applied to an electric vehicle (EV) and a hybrid vehicle (HV) driven by an electric driving source, or an energy storage system (ESS), an uninterruptible power supply (UPS) system, or the like using a medium and large battery used for a house or an industry, as well as a portable device.

The secondary battery attracts attention as a new energy source that is environmentally-friendly and has improved energy efficiency in that it is possible to innovatively decrease use of fossil fuel, which is the primary advantage, while not generating a by-product when using energy.

The secondary battery applied to the EV or the energy storage source is typically used in a form, in which a plurality of unit secondary battery cells is combined, to improve adaptiveness to a high capacity environment, which, however, is not essentially applied to a case where the secondary battery is implemented as a battery of a portable terminal and the like.

When the battery, particularly, the plurality of secondary batteries alternately performs charging and discharging, it is necessary to manage the battery to maintain appropriate operation state and performance by efficiently controlling charging/discharging of the secondary batteries.

To this end, a battery management system (BMS) managing a state and performance of the battery is provided. The BMS may include a battery management controller (BMC) which includes a measuring device measuring a voltage, a current, a temperature, and the like of the battery, and a control device controlling operations of the battery and a switching device when it is diagnosed that the battery has a problem based on the measured value, and a battery disconnecting unit (BDU) which may disconnect the battery for protecting a load when it is diagnosed that the battery has a problem based on the measured value of the battery.

In the existing BMC, a measuring device connected to a battery side that is a high voltage part and a control unit controlling the battery based on the measured value are connected through one line, so that there are problems in that it is necessary to use an electronic component in which insulation is secured between the measuring device and the control unit, and insulation resistance between the measuring device and the control unit is decreased by the measuring device due to a high voltage. When the insulation resistance is decreased, interline short-circuit failure may be generated between the measuring device and the control unit, and reliability of the BMS is degraded.

Accordingly, it is necessary to provide a battery management system which stably drives a battery by solving the problem, such as the decrease in insulation resistance caused by the BMC positioned inside the BMS, and has reliability based on the stable driving of the battery.

DETAILED DESCRIPTION OF THE INVENTION

Technical Problem

A secondary battery, which has high application easiness according to a product group and an electric characteristic, such as a high energy density, has been universally applied to an electric vehicle (EV) and a hybrid vehicle (HV) driven by an electric driving source, or an energy storage system (ESS), an uninterruptible power supply (UPS) system, or the like using a medium and large battery used for household or industry, as well as a portable device.

The secondary battery attracts attention as a new energy source that is environmentally-friendly and has improved energy efficiency in that it is possible to innovatively decrease use of fossil fuel, which is the primary advantage, while not generating a by-product when using energy.

The secondary battery applied to the EV or the energy storage source is typically used in a form, in which a plurality of unit secondary battery cells is combined, to improve adaptiveness to a high capacity environment, which, however, is not essentially applied to a case where the secondary battery is implemented as a battery of a portable terminal and the like.

When the battery, particularly, the plurality of secondary batteries alternately performs charging and discharging, it is necessary to manage the battery to maintain appropriate operation state and performance by efficiently controlling charging/discharging.

To this end, a battery management system (BMS) managing a state and performance of the battery is provided. The BMS may include a battery management controller (BMC) which includes a measuring device measuring a voltage, a current, a temperature, and the like of the battery, and a control device controlling operations of the battery and a switching device when it is diagnosed that the battery has a problem based on the measured value, and a battery disconnecting unit (BDU) which may disconnect the battery for protecting a load when it is diagnosed that the battery has a problem based on the measured value of the battery.

In the existing BMC, a measuring device connected to a battery side that is a high voltage part and a control unit controlling the battery based on the measured value are connected through one line, so that there are problems in that it is necessary to use an electronic component in which insulation is secured between the measuring device and the control unit, and insulation resistance between the measuring device and the control unit is decreased by the measuring device due to a high voltage. When the insulation resistance is decreased, interline short-circuit failure may be generated between the measuring device and the control unit, and reliability of the BMS is degraded.

Accordingly, it is necessary to provide a battery management system which stably drives a battery by solving the problem, such as the decrease in insulation resistance caused by the BMC positioned inside the BMS, and has reliability based on the stable driving of the battery.

Technical Solution

A system for managing a battery according to an exemplary embodiment of the present invention includes: one or more switches which connect a battery and a load; a voltage measuring unit which measures a voltage value of the battery; a control unit which controls the one or more switches based on the measured voltage value; and a communicating unit which transmits the measured voltage value to the control unit, in which the voltage measuring unit, the one or more switches, and the communicating unit are formed as a battery disconnecting unit (BDU), and the control unit is positioned outside the BDU.

The BDU may be positioned at the battery side, and the control unit may be positioned at the load side.

The system may further include a reference voltage generating unit which is connected with the battery in parallel and generates a reference voltage, in which the reference voltage generating unit may generate a first reference voltage based on which overcharging of the battery is determined, and a second reference voltage based on which overdischarging of the battery is determined.

The control unit may include: a switch control unit which controls an operation of the switch; and a diagnosing unit which diagnoses a state of the battery based on the measured voltage value of the battery and the generated reference voltages.

The diagnosing unit may include a comparing unit which compares the voltage of the battery with the first reference voltage and the second reference voltage, and when the voltage of the battery is larger than the first reference voltage or the battery voltage is smaller than the second reference voltage, the diagnosing unit may output a switch control signal controlling the one or more switches.

The communicating unit may further include: an insulating unit which electrically insulates the measured voltage value; and a transmitting unit which transmits the electrically insulated voltage value to the control unit.

The voltage measuring unit, the communicating unit, and the control unit may be connected to a controller area network (CAN) bus, so that the voltage measuring unit and the control unit may perform CAN communication.

Advantageous Effects

According to one aspect of the present invention, it is possible to provide the battery management system, in which a voltage measuring unit and a control unit are separated in an existing battery management controller and the voltage measuring unit is included in the battery disconnecting unit, thereby preventing insulation resistance between the voltage measuring unit and the control unit from being decreased.

Further, it is possible to provide the battery management system, in which a voltage measured by the voltage measuring unit is electrically insulated and is provided to the control unit, thereby being applicable to a non-insulative low-cost electronic component, and decreasing noise and decreasing an analog measurement error due to the noise.

BRIEF DESCRIPTION OF DRAWINGS

FIG. 1 is a diagram schematically illustrating an electric vehicle to which a battery management system according to an exemplary embodiment of the present invention is applicable.

FIG. 2 is a diagram schematically illustrating the battery management system according to the exemplary embodiment of the present invention.

FIG. 3 is a diagram schematically illustrating a configuration of a battery disconnecting unit in the battery management system according to the exemplary embodiment of the present invention.

FIG. 4 is a flowchart illustrating a method of managing a battery through the battery management system according to an exemplary embodiment of the present invention.

MODE FOR CARRYING OUT THE INVENTION

The present invention will be described below in detail with reference to the accompanying drawings. Herein, repeated descriptions and the detailed description of a publicly known function and configuration that may make the gist of the present invention unnecessarily ambiguous will be omitted. Exemplary embodiments of the present invention are provided so as to more completely explain the present invention to those skilled in the art. Accordingly, the shape, the size, etc., of elements in the figures may be exaggerated for more clear explanation.

Throughout the specification and the claims, unless explicitly described to the contrary, the word "include/comprise" and variations such as "includes/comprises" or "including/comprising" mean further including other constituent elements, not excluding the other constituent elements.

In addition, the term " . . . unit" described in the specification means a unit for processing at least one function and operation and may be implemented by hardware components or software components and combinations thereof.

FIG. 1 is a diagram schematically illustrating an electric vehicle to which a battery management system according to an exemplary embodiment of the present invention is applicable.

FIG. 1 illustrates an example, in which a battery management system 100 according to the exemplary embodiment of the present invention is applied to an electric vehicle 1, but the battery management system 100 included in the exemplary embodiment of the present invention is applicable to any technical field, such as an energy storage system (ESS) for a house or an industry or an uninterruptible power supply (UPS) system, to which a secondary battery is applicable, in addition to the electric vehicle.

The electric vehicle 1 may include a battery 10, a battery management system (BMS) 20, an electronic control unit (ECU) 30, an inverter 40, and a motor 50.

The battery 10 is an electric energy source for driving the electric vehicle 1 by providing driving force to the motor 50. The battery 10 may be charged or discharged by the inverter 40 according to the driving of the motor 50 and/or an internal combustion engine (not illustrated).

Here, the kind of battery 10 is not particularly limited, and for example, the battery 10 may include a lithium ion battery, a lithium polymer battery, a nickel cadmium battery, a nickel hydrogen battery, and a nickel zinc battery.

Further, the battery 10 is formed of a battery module, in which a plurality of battery cells is connected in series and/or in parallel, and a battery pack is formed of the plurality of battery modules. Further, the battery 10 may include one or more battery packs.

The BMS 20 estimates a state of the battery 10, and manages the battery 10 by using information on the estimated state. For example, the BMS 20 estimates and manages state information of the battery 10, such as a state of charging (SOC), a state of health (SOH), the amount of maximum input/output allowance power, and an output voltage of the battery. Further, the BMS 20 controls charging or discharging of the battery 10 by using the state information, and further, a replacement time of the battery 10 may be estimated.

The BMS 20 may be the battery management system 100 according to the exemplary embodiment of the present invention to be described below. Further, the BMS 20 may include the battery management system 100 according to the exemplary embodiment of the present invention or may be operated while being connected with the battery management system.

Similar to the battery management system 100, in the BMS 20, a measuring device measuring a current, a voltage, a temperature, and the like of the battery is separated from the control unit and the measuring device is included in a battery disconnecting unit including a switching unit so that it is possible to preventing insulation resistance between the measuring device and the control unit from being degraded and decrease an interline short-circuit and noise.

The ECU 30 is an electronic control device for controlling a state of the electric vehicle 1. For example, the ECU 30 determines a torque level based on information about an accelerator, a brake, a speed, and the like, and controls an output of the motor 50 to correspond to torque information.

Further, the ECU 30 transmits a control signal to the inverter 40 so that the battery 10 is charged or discharged by the BMS 20.

The inverter 40 makes the battery 10 be charged or discharged based on the control signal of the ECU 30.

The motor 50 drives the electric vehicle 1 based on control information (for example, the torque information) transmitted from the ECU 30 by using electric energy of the battery 10.

Hereinafter, the battery management system according to the exemplary embodiment of the present invention will be described with reference to FIGS. 2 and 3.

FIG. 2 is a diagram schematically illustrating the battery management system according to the exemplary embodiment of the present invention.

Referring to FIG. 2, the battery management system according to the exemplary embodiment of the present invention may include a voltage measuring unit 110, a switch 120, a reference voltage generating unit 130, a communicating unit 140, and a control unit 150.

The battery management system 100 illustrated in FIG. 2 is in accordance with the exemplary embodiment, and the constituent elements of the battery management system 100 are not limited to the exemplary embodiment illustrated in FIG. 2, and the constituent elements may be added, changed, or deleted as necessary.

The voltage measuring unit 110 may measure a voltage value of the battery 10 module. For example, the voltage measuring unit 110 may measure a voltage of the battery 10 by measuring voltages applied to both ends of a shunt resistor serially connected with the battery 10.

Herein, when the plurality of battery 10 modules is used in series or in parallel, one or more voltage measuring units may be included so as to measure one or more battery 10 modules, respectively, and one voltage measuring unit 110 may measure the plurality of battery modules 10 or the entire battery 10 modules.

The switch 120 may connect the battery 10 and a load, and when the control unit 150 to be described below diagnoses that the battery 10 module is in an abnormal state based on the voltage value measured by the voltage measuring unit 110, the switch 120 may disconnect the battery 10 and the load by switching off the switch 120.

One or more switches 120 may be provided in order to improve stability of the connection and the disconnection of the battery 10 module and the load, and the kind and the number of switches 120 may be determined according to a demand of a user, a required stability, and the like. For example, the switch 120 may be formed with one or more switching devices, such as a relay, a contactor, a transistor, and a thyristor.

The reference voltage generating unit 130 may be connected with the battery 10 module in parallel and generate a reference voltage for diagnosing a state of the battery 10 module.

The reference voltage generating unit 130 may generate a first reference voltage for diagnosing overcharging of the battery 10 module and a second reference voltage for diagnosing overdischarging of the battery 10 module, and the control unit 150 to be described below may diagnose a state of the battery 10 module based on the first reference voltage, the second reference voltage, and the voltage value of the battery 10 module measured by the voltage measuring unit 110.

The communicating unit 140 may transmit the voltage value measured by the voltage measuring unit 110 to the control unit 150 to be described below, and to this end, the communicating unit 140 may include an insulating unit 141 and a transmitting unit 142.

The insulating unit 141 may electrically insulate the voltage measured by the voltage measuring unit 110 from the first and second reference voltages generated by the reference voltage generating unit 120. For example, the insulating unit 141 may include a plurality of encoders and decoders. The voltage measured by the voltage measuring unit 110 and the first and second reference voltages may be encoded through the encoders and may be decoded through the decoders to be electrically insulated. The electrically insulated voltage value is transceived, thereby decreasing noise and decreasing an analog measurement error by the noise through the decrease in the noise.

The transmitting unit 142 may transmit the voltage value electrically insulated by the insulating unit 141 to the control unit 150 to be described below.

The control unit 150 may diagnose a state of the battery 10 module based on the insulated voltage value transmitted from the transmitting unit 142 and the first and second reference voltages generated by the reference voltage generating unit 130. Further, the control unit 150 may control an on or off operation of one or more switches 120 according to a result of the diagnosis, and to this end, the control unit 150 may include a diagnosing unit 151 and a switch control unit 152.

The diagnosing unit 151 may compare the voltage value of the battery 10 module measured by the voltage measuring unit 110 with the first and second reference voltages and diagnose a state of the battery 10 module. To this end, the diagnosing unit 151 may include a comparing unit (not illustrated) which compares the voltage of the battery 10 module with the first reference voltage and the second reference voltage.

The diagnosing unit 151 may compare the voltage of the battery 10 module with the first and second reference voltages through the comparing unit, and diagnose a state of the battery based on a result of the comparison. For example, when the measured voltage value of the battery 10 module is equal to or larger than the first reference voltage, the diagnosing unit 151 may diagnose that the battery 10 module is in an overcharging state, and when the measured voltage value of the battery 10 module is equal to or smaller than the second reference voltage, the diagnosing unit 151 may diagnose that the battery 10 module is in an overdischarging state. As described above, when the diagnosing unit 151 diagnoses that the battery is in the overcharging or overdischarging state, the diagnosing unit 151 may output a switch control signal operating the switch control unit 152 to be described below.

Herein, the switch control signal may be a signal switching on or off each of one or more switches or the plurality of switches.

When the switch control signal is output from the diagnosing unit 151, the switch control unit 152 switches off one or more switches 120, thereby disconnecting a load from the battery 10 module that is in the abnormal state and protecting the load.

FIG. 3 is a diagram schematically illustrating a configuration of the battery disconnecting unit in the battery management system according to the exemplary embodiment of the present invention.

Referring to FIG. 3, the voltage measuring unit 110, the one or more switches 120, and the communicating unit 140 may be formed as one battery disconnecting unit 160, and may be positioned at the battery 10 module side to which a high voltage is applied. Further, the control unit 150 may be positioned outside the battery disconnecting unit 160, and may be positioned at a load side to which a low voltage is applied. Herein, the high voltage may be a direct-current voltage of 60 V and an alternating-current voltage of 25 V, and a voltage which is relatively lower than the high voltage may be referred to as a low voltage.

When the voltage measuring unit 110 is separated from the control unit 150, and mutual information is exchanged through the communicating unit 140, noise may be generated by various reasons, such as a distance among the voltage measuring unit 110, the communicating unit 140, and the control unit 150, and the number of peripheral constituent elements, and a material of a peripheral constituent element, and the noise negatively influences an accurate analog measurement. In order to complement the problem, the voltage measuring unit 110, the communicating unit 140, and the control unit 150 may be connected through a controller area network (CAN) bus, and may exchange information through CAN communication through the connected CAN bus.

In the CAN communication, communication is performed so as to have an electric difference by using two lines, so that the CAN communication has advantages in being highly resistant to noise and being capable of performing communication up to a maximum of 1,000 m with 40 kbps. Accordingly, the voltage measuring unit 110 and the control unit 150 may exchange information through the CAN communication, thereby decreasing an analog measurement error by noise and more accurately calculating a result value.

Hereinafter, a method of managing a battery through the battery management system according to an exemplary embodiment of the present invention will be described with reference to FIG. 4.

FIG. 4 is a flowchart illustrating a method of managing a battery through the battery management system according to an exemplary embodiment of the present invention.

Referring to FIG. 4, when a battery management method S100 by using the battery management system 100 starts, the voltage measuring unit measures a voltage of a battery module (S110), and the reference voltage generating unit generates first and second reference voltages (S120). Herein, the battery may be a battery cell, a battery module, or a battery pack according to various elements, such as a demand of a user and a use environment, and the first and second reference voltages may be adjusted according to the various elements.

The voltage value measured in operation S110 and the voltage values generated in operation S120 are electrically insulated through the insulating unit (S130), and the voltage value electrically insulated in operation S130 is transmitted to the control unit through the transmitting unit (S140). Operation S130 and operation S140 may be CAN communication, and the electrically insulated voltage value may be transmitted to the control unit through the CAN bus.

The diagnosing unit diagnoses a state of the battery based on the voltage value transmitted in operation S140 (S150). When the voltage value measured by the voltage measuring unit is equal to or larger than the first reference voltage or equal to or lower than the second reference value (S160), the diagnosing unit outputs a switch control signal for disconnecting the battery and a load (S170). When the diagnosing unit outputs the switch control signal, the switch is switched off to disconnect the battery and the load (S180), and when the diagnosing unit does not output the switch control signal, a normal operation is performed (S190).

The foregoing battery management method S100 by using the battery management system 100 has been described with reference to the flowchart presented in the drawing. For the simple description, the method is illustrated in a series of blocks and described, but the present invention is not limited to the sequence of the blocks, and some blocks may be performed in a different order or at the same time as that of other blocks illustrated and described in the present specification, and other various branches, flow paths, and block sequences achieving the same or similar result may be carried out. Further, all of the blocks illustrated for carrying out the method described in the present specification may not be required.

In the forgoing, the specific exemplary embodiment of the present invention has been illustrated and described, but it is apparent to those skilled in the art that the technical spirit of the present invention is not limited by the accompanying drawings and the described contents, and may be modified in various forms without departing from the spirit of the present invention, and the modifications are considered to belong to the claims of the present invention without departing from the spirit of the present invention.

The invention claimed is:

1. A system for managing a battery, the system comprising:
   one or more switches which connect a battery and a load;
   a voltage measuring unit which measures a voltage value of the battery;
   a control unit which controls the one or more switches based on the measured voltage value; and a communicating unit which transmits the measured voltage value to the control unit,
wherein the voltage measuring unit, the one or more switches, and the communicating unit are formed as a battery disconnecting unit (BDU), and the control unit is positioned outside the BDU,
wherein the communicating unit includes an insulating unit which electrically insulates the measured voltage value,
wherein the insulating unit electrically insulates the measured voltage value measured by the voltage measuring unit from first and second reference voltages generated by a reference voltage generating unit,
wherein the insulating unit includes at least one encoder and at least one decoder, and
wherein the measured voltage value measured by the voltage measuring unit and the first and second reference voltages are encoded through the at least one encoder and decoded through the at least one decoder to be electrically insulated as an electrically insulated voltage value to reduce noise.

2. The system of claim 1, wherein the BDU is positioned at a battery side of the one or more switches, and the control unit is positioned at a load side of the one or more switches.

3. The system of claim 1, further comprising:
the reference voltage generating unit which is connected with the battery in parallel and generates the reference voltage,
wherein the reference voltage generating unit generates the first reference voltage based on which overcharging of the battery is determined, and the second reference voltage based on which overdischarging of the battery is determined.

4. The system of claim 3, wherein the control unit includes:
a switch control unit which controls an operation of the one or more switches; and
a diagnosing unit which diagnoses a state of the battery based on the measured voltage value and the generated first and second reference voltages.

5. The system of claim 4, wherein the diagnosing unit includes a comparing unit which compares the measured voltage value with the first reference voltage and the second reference voltage, and
when the measured voltage value is larger than the first reference voltage or the measured voltage value is smaller than the second reference voltage, the diagnosing unit outputs a switch control signal controlling the one or more switches.

6. The system of claim 1, wherein the communicating unit further includes:
a transmitting unit which transmits the electrically insulated measured voltage value to the control unit.

7. The system of claim 1, wherein the voltage measuring unit, the communicating unit, and the control unit are connected to a controller area network (CAN) bus, so that the voltage measuring unit and the control unit perform CAN communication.

* * * * *